United States Patent
Nagareda et al.

(10) Patent No.: US 10,401,204 B2
(45) Date of Patent: Sep. 3, 2019

(54) ULTRASONIC FLOW-METER FOR MEASURING THE FLOW-RATE OF A CHEMICAL-SOLUTION USING AN ELECTROMECHANICAL TRANSFORMATION DEVICE

(71) Applicant: HONDA ELECTRONICS CO., LTD., Aichi (JP)

(72) Inventors: Kenji Nagareda, Aichi (JP); Yuki Murai, Aichi (JP); Atsuhiro Hayashi, Aichi (JP); Yuichi Maida, Aichi (JP)

(73) Assignee: HONDA ELECTRONICS CO., LTD., Aichi (JP)

( * ) Notice: Subject to any disclaimer, the term of this patent is extended or adjusted under 35 U.S.C. 154(b) by 353 days.

(21) Appl. No.: 15/338,604

(22) Filed: Oct. 31, 2016

(65) Prior Publication Data

US 2017/0059378 A1   Mar. 2, 2017

Related U.S. Application Data

(63) Continuation of application No. 14/114,273, filed as application No. PCT/JP2012/066833 on Jun. 26, 2012, now abandoned.

(51) Int. Cl.
*H01L 41/187* (2006.01)
*H01L 41/08* (2006.01)
(Continued)

(52) U.S. Cl.
CPC .............. *G01F 1/662* (2013.01); *B06B 1/067* (2013.01); *B06B 1/0644* (2013.01);
(Continued)

(58) Field of Classification Search
CPC ....... B06B 1/06; B06B 1/0603; B06B 1/0644; B06B 1/067; B06B 1/0651;
(Continued)

(56) References Cited

U.S. PATENT DOCUMENTS 5,214,343 A * 5/1993 Baumoel ................ G10K 11/02
   310/327
7,391,285 B2   6/2008 Larson, III et al.
(Continued)

FOREIGN PATENT DOCUMENTS

JP   2006-158127   6/2006
JP   2008-162889   7/2008

OTHER PUBLICATIONS

R. Alsfasser et al., pp. 306-309, Aug. 29, 2007.
(Continued)

*Primary Examiner* — Derek J Rosenau
(74) *Attorney, Agent, or Firm* — Clark & Brody

(57) ABSTRACT

An electromechanical transformation device for an ultrasonic flow meter comprises an alkaline niobate piezoelectric ceramic composition and a rigid body adhered onto the major surface of the ceramic composition. The ceramic composition is made of crystal structures such as orthorhombic crystals formed at the side where the temperature is lower than the orthorhombic-to-tetragonal phase transition temperature, tetragonal crystals formed at the side where temperature is higher that the orthorhombic-to-tetragonal phase transition temperature as well as at the side where the temperature is lower than the tetragonal-to-cubic phase transition temperature, and the cubic crystals formed at the side where the temperature is higher than the tetragonal-to-cubic phase temperature. Young's modulus of the rigid is 60 GPa or more. The volume percent of the ceramic composition existing within a range where the distance from the adhesion point of the piezoelectric ceramic composition and the rigid body is 40% or more.

5 Claims, 5 Drawing Sheets

(51) Int. Cl.
*G01F 1/66* (2006.01)
*H01L 41/313* (2013.01)
*B06B 1/06* (2006.01)
*H01L 41/09* (2006.01)
*H01L 41/29* (2013.01)
*H01L 41/083* (2006.01)
*H01L 41/113* (2006.01)

(52) U.S. Cl.
CPC ............ *B06B 1/0651* (2013.01); *G01F 1/667* (2013.01); *H01L 41/083* (2013.01); *H01L 41/0825* (2013.01); *H01L 41/09* (2013.01); *H01L 41/1132* (2013.01); *H01L 41/187* (2013.01); *H01L 41/1873* (2013.01); *H01L 41/29* (2013.01); *H01L 41/313* (2013.01); *Y10T 29/42* (2015.01)

(58) Field of Classification Search
CPC ... H01L 41/0825; H01L 41/083; H01L 41/09; H01L 41/1132; H01L 41/187; H01L 41/1873
USPC ......................................... 310/322, 334, 335
See application file for complete search history.

(56) References Cited

U.S. PATENT DOCUMENTS

| | | |
|---|---|---|
| 7,781,946 B2 | 8/2010 | Izumi et al. |
| 2004/0058797 A1 | 3/2004 | Nonoyama et al. |
| 2004/0113522 A1 | 6/2004 | Nagahara et al. |
| 2005/0068124 A1 | 3/2005 | Stoemmer |
| 2006/0006766 A1 | 1/2006 | Beck |
| 2006/0232164 A1 | 10/2006 | Kondo |
| 2007/0090728 A1 | 4/2007 | Matsuda et al. |
| 2007/0200459 A1 | 8/2007 | Yoshino |
| 2008/0194967 A1 | 8/2008 | Siwa et al. |
| 2009/0091214 A1 | 4/2009 | Ozawa |
| 2011/0012051 A1 | 1/2011 | Kaigawa et al. |

OTHER PUBLICATIONS

Cheng et al., "Mechanical loss and . . . titanate based ceramics", Journal of Materials Science 31 (1996), 4951-4955.

Bruls et al., "The temperature dependence . . . of $MgSiN_2$, AlN and $Si_3N_4$", Journal of the European Ceramic Society, 21 (2001) 263-268.

* cited by examiner

ULTRASONIC FLOW-METER FOR MEASURING THE FLOW-RATE OF A CHEMICAL-SOLUTION USING AN ELECTROMECHANICAL TRANSFORMATION DEVICE

This application is a Continuation of U.S. Ser. No. 14/114,273 filed on Oct. 28, 2013, which is a national phase of PCT/JP2012/066833 filed on Jun. 26, 2012.

TECHNICAL FIELD

This invention relates to an electromechanical-transformation device comprising crystal structures that include an orthorhombic crystal formed at the side where the temperature is lower than the orthorhombic-to-tetragonal-phase transition temperature, a tetragonal crystal formed at the side where the temperature is higher than the orthorhombic-to-tetragonal-phase transition temperature, and at the side where the temperature is lower than the tetragonal-to-cubic-phase transition temperature, and a cubic crystal formed at the side where the temperature is higher than the tetragonal-to-cubic-phase transition temperature, and to a method for manufacturing the same device.

TECHNICAL BACKGROUND

A piezoelectric ceramic composition is nowadays used for an electromechanical transformation device such as actuators, ultrasonic-sensors, ultrasonic-transducers or the like. A piezoelectric-ceramic composition showing an excellent piezoelectric property contains a lead compound such as lead zirconate titanate (PZT) or the like. However, that is a cause for concern regarding the negative affect that it has on the environment. Therefore, a piezoelectric-ceramic composition that is free of such a lead-compound is now attracting attention and is being researched and developed. As disclosed below in Patent Reference One, the potassium-sodium-niobate-system piezoelectric-ceramic composition is just such a composition that is free of lead and yet has an excellent piezoelectric property of a relatively high electromechanical-coupling coefficient as well as a relatively high Curie temperature Tc, so that it can appropriately be used under high temperatures.

The type of piezoelectric-ceramic composition showing an excellent piezoelectric property that is nowadays used in the making of electromechanical-transformation devices such as actuators, ultrasonic-sensors, ultrasonic-transducers or the like contains a lead compound such as lead zirconate titanate (PZT) or the like. However, that type of piezoelectric-ceramic composition is a cause for concern regarding the negative affect that it has on the environment. Therefore, a piezoelectric-ceramic composition that is free of such a lead compound is now attracting attention and is being researched and developed. As disclosed below, in Patent Reference One, the potassium-sodium-niobate-system piezoelectric-ceramic composition is just such a composition that is free of lead and yet has an excellent piezoelectric property of a relatively high electromechanical-coupling coefficient, as well as a relatively high Curie temperature Tc, so that said composition can appropriately be used under high temperatures.

The potassium-sodium-niobate-system piezoelectric-ceramic composition incorporates a crystalline-phase of a perovskite structure that is shown as composition-formula $ABO_3$. Although the perovskite structure depends on this type of composition, the piezoelectric-ceramic composition incorporating the potassium-sodium-niobate-system material reveals the tetragonal-to-cubic-phase transition temperature Tc to be about 300 to 400 degrees Celsius and the orthorhombic-to-tetragonal-phase transition temperature To-t to be about −30 degrees to +100 degrees Celsius. If such a piezoelectric-ceramic composition is used in the making of an electromechanical-transformation device, then polarization is typically done by applying a high electric field within the temperature-range required to form the tetragonal-crystal to get the piezoelectric property.

PRIOR ART DOCUMENTS

Patent Document One: JP-A-2008-162889

DISCLOSURE OF THE INVENTION

Problems to be Resolved by the Invention

If an electromechanical-transformation device is used under the temperature exceeding the tetragonal-to-cubic-phase transition temperature Tc, polarization will be disordered, and the piezoelectric property will be lost (i.e. depolarization will occur). Depolarization moderately occurs at a temperature ranging from 100 to 150 degrees Celsius lower than the tetragonal-to-cubic-phase transition temperature Tc. Thus, to design an electromechanical-transformation device properly, it is necessary to set the upper-limit operating temperature of the device at 100 degrees or lower than the tetragonal-to-cubic-phase transition temperature Tc. Yet, the piezoelectric property of such an electromechanical-transformation device deteriorates over time per changes in the orthorhombic-to-tetragonal-phase transition temperature To-t. Therefore, to keep long-term product reliability, it is better that the orthorhombic-to-tetragonal-phase transition temperature To-t not be within the electromechanical-transformation-device operating temperature.

An ultrasonic flow meter must be used to measure the flow-volume of the chemical-solution circulation-line that is integrated in the semiconductor manufacturing equipment in an inhospitable environment under an operating temperature ranging from 0 to 200 degrees Celsius. To satisfy long-term product liability of the ultrasonic sensor (electromechanical-transformation device) to be used in such a flow meter, a piezoelectric-ceramic composition that has, for instance, a tetragonal-to-cubic-phase transition temperature Tc of 340 degrees C. or higher and an orthorhombic-to-tetragonal-phase transition temperature To-t of minus 20 degrees Celsius or lower, must be used. To achieve a potassium-sodium-niobate-system piezoelectric-ceramic composition that satisfies the condition of the phase-transition temperature and has a preferable piezoelectric property, modifications of such a composition are currently underway. However, such a suitable composition has yet to be developed.

This invention has achieved, in light of the aforementioned problems, in providing an electromechanical-transformation device of which the piezoelectric property is unlikely to deteriorate over time, even if changes in temperature should occur, including changes in the orthorhombic-to-tetragonal-phase transition temperature. Also, a preferable method for manufacturing this electromechanical-transformation device, as described above, has been provided.

Means of Solving the Problems

To solve the aforementioned problems, the first aspect of this invention refers to an electromechanical-transformation device comprising crystal structures that include an orthorhombic crystal formed at the side where the temperature is lower than the orthorhombic-to-tetragonal-phase transition temperature, a tetragonal crystal formed at the side where the temperature is higher than the orthorhombic-to-tetragonal-phase transition temperature, and at the side where the temperature is lower than the tetragonal-to-cubic-phase transition temperature, and a cubic crystal formed at the side where the temperature is higher than the tetragonal-to-cubic-phase transition temperature, and wherein the electromechanical-transformation device comprises a piezoelectric-ceramic composition of which the volume-percentage, being within the range of which the distance from the point of attachment of the rigid body to the piezoelectric-ceramic composition is two mm or less, is 40% or more as compared to the whole piezoelectric-ceramic composition, and wherein the electromechanical-transformation device comprises a rigid body having a Young's modulus of 60 GPa or more, which is directly adhered to the major surface of a piezoelectric-ceramic composition or indirectly to the major surface by the intermediary electrodes.

According to the first aspect of this invention, the relatively hard rigid body, having a Young's modulus of 60 GPa or more, is adhered to the major surface of the piezoelectric-ceramic composition or to the electrodes formed on the major surface of said composition. The adhesion area of the hard rigid body is sufficiently secured such that the percentage in mass of the piezoelectric-ceramic composition, being within the range of two mm or less from the point of attachment between the piezoelectric-ceramic composition and the rigid body, is 40% or more. As such, the rigid body adhered to the piezoelectric-ceramic composition makes it difficult to create the phase-transition of the crystal structures of the piezoelectric-ceramic composition even if a change should occur in the orthorhombic-to-tetragonal-phase transition temperature. Even when a phase-transition of the crystal structures of the piezoelectric-ceramic composition occurs, then lattice-distortion of the crystal structures will occur. Then, expansion or contraction of the piezoelectric-ceramic composition due to the variation in temperature (i.e. the linear-thermal expansion-coefficient) becomes extremely greater compared to that of the rigid body. Of this invention, by adhering the rigid body to the piezoelectric-ceramic composition, the external force will work in the direction where the lattice-distortion done by the phase-transition is controlled. Thus, phase-transition is unlikely to occur, thus making it harder to control further depolarization caused by repetition of the lattice-distortion during the phase-transition. Therefore, this invention makes it possible to control time-dependent deterioration of the piezoelectric property of the piezoelectric-ceramic composition, thus improving the reliability of this electromechanical-transformation device.

The second aspect of this invention refers to the electromechanical-transformation device according to first aspect of this invention, whereof the orthorhombic-to-tetragonal-phase transition temperature is within the range of the operating temperature of said device and/or within the range of the storing temperature of said device, and that the tetragonal-to-cubic-phase transition temperature is within the range higher than the operating temperature.

According to the second aspect of this invention, the temperature of the electromechanical-transformation device varies during either use or storage and exceeds the orthorhombic-to-tetragonal transition temperature or falls below said temperature. Even if such a variation in temperature should occur, the rigid body adhered to the piezoelectric-ceramic composition makes phase-transition of the crystal structures unlikely, thus controlling degradation of the piezoelectric property over time. Also, the temperature of the device will never exceed the orthorhombic-to-cubic-transition temperature whilst the device is being used, thus making it possible to avoid loss of the piezoelectric-ceramic composition due to further depolarization of said composition.

The third aspect of this invention refers to an electromechanical-transformation device, according to the first or second aspect of this invention, whereof a rigid body is adhered to the piezoelectric-ceramic composition by a thermosetting resin-adhesive.

According to the third aspect of this invention, by using a thermosetting resin-adhesive, heating the piezoelectric-ceramic composition to the curing temperature of said adhesive makes it possible to adhere the rigid body whilst the piezoelectric-ceramic composition is in the state of a tetragonal-crystal structure. Such a rigid body makes the tetragonal-to-orthorhombic phase transition of the piezoelectric-ceramic composition unlikely, thus controlling further depolarization of said composition.

The fourth aspect of this invention refers to the electromechanical-transformation device, according to the first or second aspect of this invention, whereof the rigid body is adhered to the piezoelectric-ceramic composition by an epoxide-based adhesive.

According to the fourth aspect of this invention, in using an epoxide-base adhesive, adhesion of the rigid body is suitably secured, and such an adhesive is stiff enough to transmit vibrations, so that the ultrasonic vibrations of the electromechanical-transformation device is efficiently generated.

The fifth aspect of this invention refers to the electromechanical-transformation device, according to the third or fourth aspect of this invention, whereof the adhesive that adheres the rigid body to the piezoelectric-ceramic composition has a curing temperature within the range exceeding the orthorhombic-to-tetragonal-phase transition temperature by 50 degrees Celsius or more and that is falls below the tetragonal-to-cubic-phase transition temperature by 50 degrees Celsius or more.

According to the fifth aspect of this invention, heating the piezoelectric-ceramic composition to the temperature at which said composition becomes a tetragonal crystal, the adhesive hardens, and thus adhering the rigid body to said composition. The adhesive curing temperature is lower than the tetragonal-to-cubic transition temperature, so that the crystal structure of the piezoelectric-ceramic composition does not become a cubic crystal whilst the rigid body is being adhered to said composition, thus preventing said composition from being depolarized. Even if the tetragonal-to-cubic transition temperature should become lower than the orthorhombic-to-tetragonal transition temperature, whilst the electromechanical-transformation device is being used, the rigid body that is adhered to the piezoelectric-ceramic composition makes the tetragonal-to-orthorhombic phase transition unlikely, thus preventing the piezoelectric property of the piezoelectric-ceramic composition from degrading over time.

The sixth aspect of this invention refers to the electromechanical-transformation device, according to any one of the first to fifth aspects of this invention, whereof the piezoelectric-ceramic composition is formulized as $\{Li_x(K_{1-y}Na_y)_{1-x}\}_a(Nb_{1-z-w}Ta_zSb_w)O_3$ within the composition-range of $0.90 \le a \le 1.2$, $0.02 \le x \le 0.2$, $0.2 \le y \le 0.8$, $0 \le z \le 0.5$, $0 \le w \le 0.2$.

According to the sixth aspect of this invention, it is possible to obtain an alkali-niobate piezoelectric-ceramic composition of a preferable piezoelectric property at the Curie temperature of 340 degrees Celsius or more and at the piezoelectric constant $d_{33}$ of 260 pC/N or more. The electromechanical-transformation device made of such a piezoelectric-ceramic composition fully secures product reliability.

The seventh aspect of this invention refers to the electromechanical-transformation device, according to any one of the first to sixth aspects of this invention, whereof the rigid body is made of a ceramic composition containing silica, alumina, or silica-alumina in major proportions.

According to the seventh aspect of this invention, it is possible to obtain a rigid body having a Young's modulus of 60 GPa or more. Also, in emitting ultrasonic sound waves from the electromechanical-transformation device into a liquid, it is possible to apply the piezoelectric-ceramic composition of silica ($SiO_2$) or alumina in major proportions to the surface of the electromechanical-transformation device to make it function as an acoustic-matching layer, thus improving the acoustic-radiation efficiency of the ultrasonic sound waves.

The eighth aspect of this invention refers to the electromechanical-transformation device, according to any one of the first to seventh aspects of this invention, whereof the piezoelectric-ceramic composition comprises a major surface acting as an acoustic-radiation surface, and that the rigid body that is adhered to the acoustic-radiation surface of said composition acts as an acoustic-matching layer to emit ultrasonic waves, and that the thickness of the rigid body is formulized as $t=\{v/(4f)\}\pm10\%$ or $t=[v/(2f)]\pm10\%$ of which f means the resonance-frequency of the piezoelectric-ceramic composition and v means the acoustic-velocity of the rigid body and t means the thickness of the rigid body.

According to the eighth aspect of this invention, the piezoelectric-ceramic composition is formed in such a way that the rigid body is adhered to the major surface that acts as an acoustic-radiation surface, with the rigid body of thickness t corresponding to ½ or ¼ of the wavelength $\lambda$ (=v/f) of the ultrasonic sound waves being emitted from the acoustic-radiation surface, thus enabling the rigid body to act as the acoustic-matching layer, thus making it possible to emit said ultrasonic sound waves efficiently from the electromechanical-transformation device, in which case it is unnecessary to prepare the rigid body and acoustic-matching layer separately, thus reducing the cost of the components in making the electromechanical-transformation device.

The ninth aspect of this invention refers to the method for manufacturing the electromechanical-transformation device, according to any one of the first to eighth aspects of the invention, with the method comprising a polarization-process in which a pair of electrodes is formed on the piezoelectric-ceramic composition, and in which polarization is provided on said composition by impressing a direct current of electricity between the electrodes; and comprising an adhesion-process in which the piezoelectric-ceramic composition and the rigid body are adhered together by a thermosetting-adhesive of a curing temperature-range exceeding the orthorhombic-to-tetragonal-phase transition temperature by 50 degrees Celsius or more and falling below the tetragonal-to-cubic-phase transition temperature by 50 degrees Celsius or more, and that in the adhesion-process the thermosetting-adhesive is heated within the curing temperature-range after completion of the foregoing polarization-process.

According to the ninth aspect of this invention, in the polarization-process, a direct current of electricity is impressed between the pair of electrodes formed on the piezoelectric-ceramic composition to polarize said composition. Then, using the thermosetting-adhesive of a curing temperature-range exceeding the orthorhombic-to-tetragonal-phase transition temperature 50 degrees Celsius or more and falling below the orthorhombic-to-tetragonal-phase transition temperature by 50 degrees Celsius or more, and by heating the piezoelectric-ceramic composition within the curing temperature range, the thermosetting-adhesive hardens, thus causing the rigid body to adhere to the piezoelectric-ceramic composition. Such heating causes the crystal structures of the piezoelectric-ceramic composition to become a tetragonal crystal, thus adhering the rigid body to said composition, and in which case the temperature of the electromechanical-transformation device becomes lower than the orthorhombic-to-tetragonal-phase transition-temperature, so that the rigid body induces an external force to maintain lattice-distortion of the tetragonal crystal. As a result, the orthorhombic-to-tetragonal phase-transition of the piezoelectric-ceramic composition is unlikely to occur, thus preventing depolarization of said composition. Therefore, it is possible to prevent the piezoelectric property of the piezoelectric-ceramic composition from deteriorating over time, so that a highly reliable electromechanical-transformation device can be manufactured.

Effects of the Invention

As described above, the first to eighth aspects of this invention provide an electromechanical-transformation device of which the piezoelectric property is unlikely to deteriorate over time even if changes occur in the orthorhombic-to-tetragonal-phase transition-temperature, and that the ninth aspect provides the preferable method for manufacturing said device.

MODES FOR CARRYING OUT THE INVENTION

Hereinafter, the embodiments of the electromechanical-transformation device of this invention are described in reference to the figures.

Figure 1:
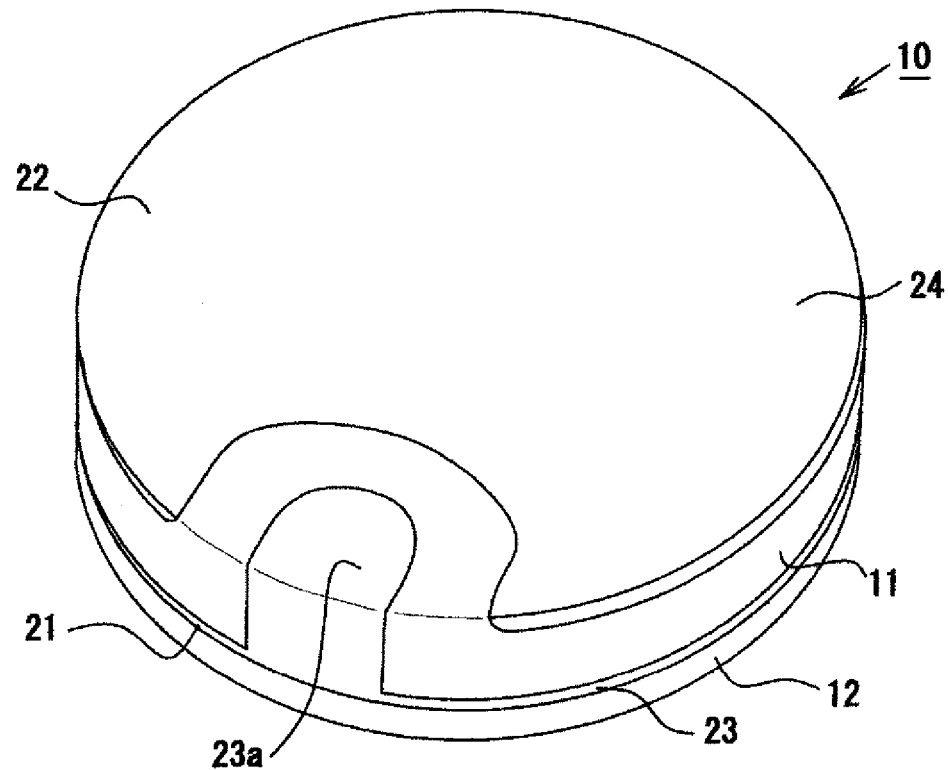
FIG. 1 is the oblique-perspective view of the electromechanical-transformation device as the embodiment of this invention.

FIG. 1 is the oblique-perspective view of the electromechanical-transformation device 10 as the embodiment of this invention.

Figure 2:
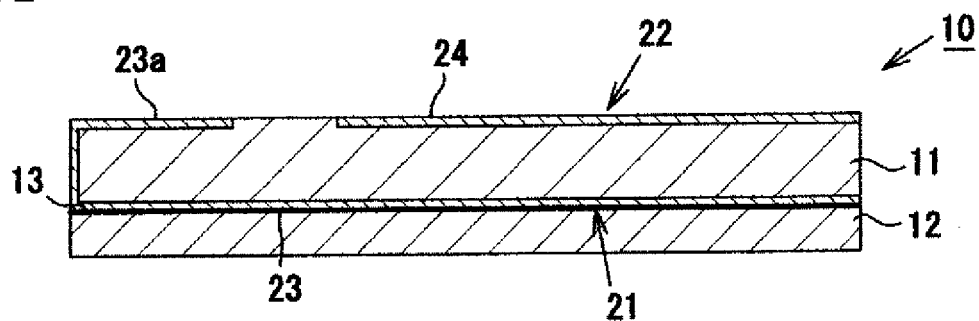
FIG. 2 is the cross-sectional view of the electromechanical-transformation device as the embodiment of this invention.

FIG. 2 is the cross-sectional view of the electromechanical transformation device 10. As shown in FIGS. 1 and 2, the electromechanical-transformation device 10 comprises a piezoelectric-ceramic composition 11 and a rigid body 12 that is adhered to the piezoelectric-ceramic composition 11. The electromechanical-transformation device 10 of this invention is used as an ultrasonic sensor of the ultrasonic flow meter. (See FIG. 3)

Figure 3:
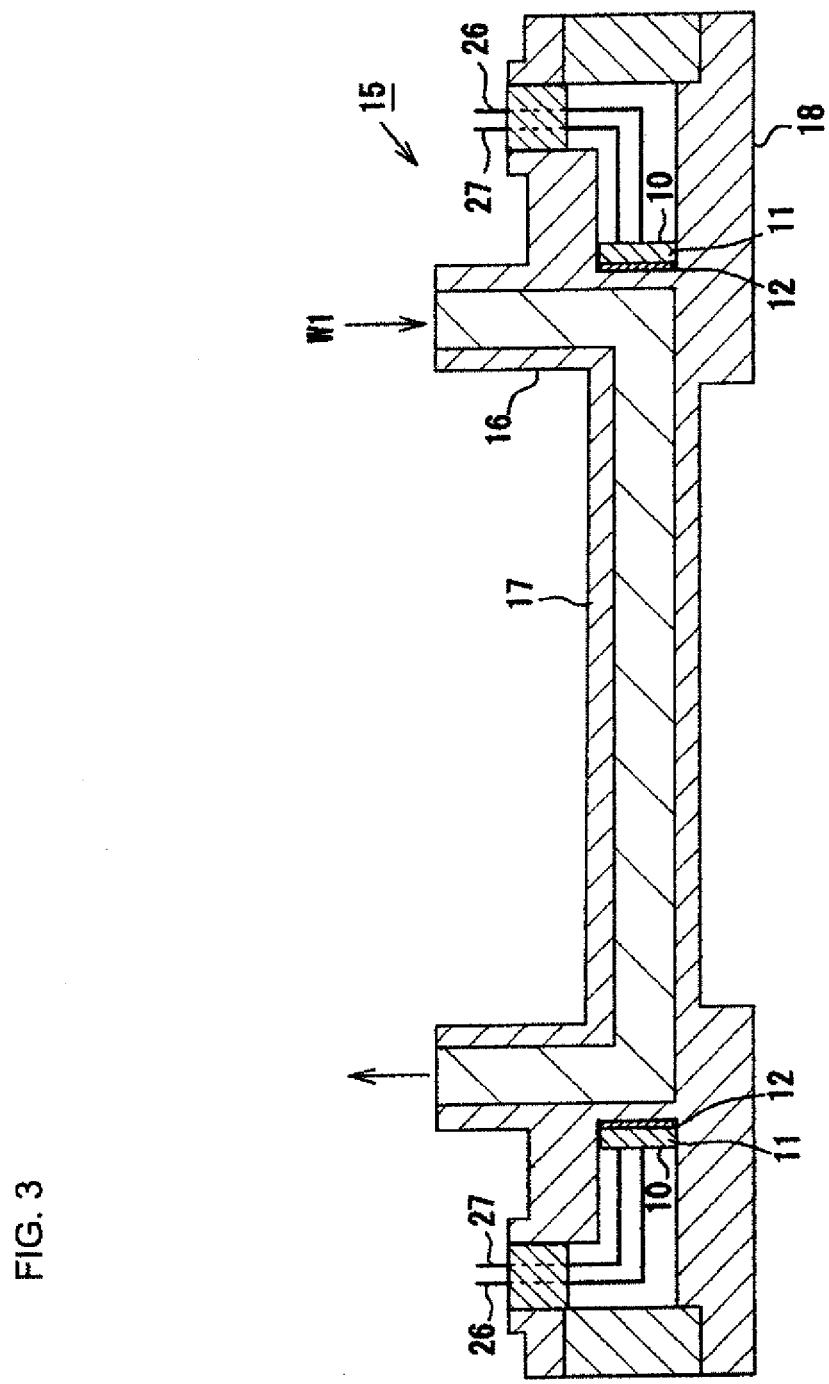
FIG. 3 is a cross-sectional view of the skeleton framework of the ultrasonic flow meter.

The ultrasonic flow meter 15, as shown in FIG. 3, is provided on the chemical-solution circulating-line to measure the volume of the chemical-solution W1 flowing through the semiconductor-manufacturing equipment. The ultrasonic flow meter 15 consists of a U-shaped tube 16, 17, with an electromechanical-transformation device 10 provided at either edge of said tube, which transmits and receives ultrasonic waves through the chemical solution W1, thereby measuring the velocity of said solution by the difference in time of the ultrasonic waves pulsing to and fro against the solution.

Of the embodiment of this invention, the electromechanical-transformation device 10 comprises a piezoelectric-ceramic composition 11 consisting of a disk-shaped potassium-sodium niobate-series (alkaline niobate-series) that is 10 mm in diameter, 1.4 mm thick, and has a Young's modulus of approximately 100 GPa to 130 Gpa. The rigid body 12 of the electromechanical-transformation device 10 is also disk-shaped, is made of silica ($SiO_2$), is 10 mm in diameter and 0.7 mm thick, and, as an embodiment of this invention, is of a plate-like structure of the same outer diameter as that of the piezoelectric-ceramic composition 11, but is thinner and has a Young modulus of 60 GPa and a linear expansion-coefficient of 8 ppm/° C.

The piezoelectric-ceramic composition 11 comprises a first-major acoustic-radiation surface 21 and a second-major rear surface 22, and a pair of electrodes 23 and 24 (including the folded electrode 23a) provided on said surfaces 21 and 22 of said composition 11, of which the electrode 23 is provided on the first-major acoustic-radiation surface 21 to which the rigid body 12 is adhered by the intermediary of the electrode 23. Of the piezoelectric-ceramic composition 11, the folded part 23a of the first electrode 23 (of the main acoustic-radiation surface 21) and the second electrode 24 provided on the second rear surface 22 are connected to the external wiring (signal wire 26 and ground wire 27 as shown in FIG. 3). Of the second rear surface 22, the electrodes 23a and 24 are separated by the piezoelectric-ceramic composition 11 between them.

The rigid body 12 of the embodiment of this invention is adhered to the entire first-major surface 21 of the piezoelectric-ceramic composition 11, which said surface 21 acts as an acoustic-radiation surface to emit ultrasonic sound waves. The rigid body 12 is t (=0.7 mm) thick and is formed according to Formula (1): t={v/(4f)}±10% of which t means the thickness (=0.7 mm) and f means the resonance-frequency of the piezoelectric-ceramic composition 11 and v means the sound-velocity within the rigid body 12.

The rigid body 12 is of thickness t, which is ¼ times that of the ultrasonic wavelength Α (=v/f). The resonance-frequency of the piezoelectric-ceramic composition 11 is 2 MHz, and the acoustic-velocity v within the rigid body 12 is approximately 5,600 m/s. Being of such thickness t, the rigid body 12 acts as an acoustic-matching layer. The adhesion-layer 13 between the piezoelectric-ceramic composition 11 and the rigid body 12 is about tens of p thick, which does not affect the propagation of the ultrasonic wavelength Α (=v/f), which adhesion-layer 13 is thinner than the rigid body 12. The adhesion layer 13 of this embodiment is composed of for example a thermosetting epoxy-resin that is cured at 150 degrees Celsius.

Figure 4:
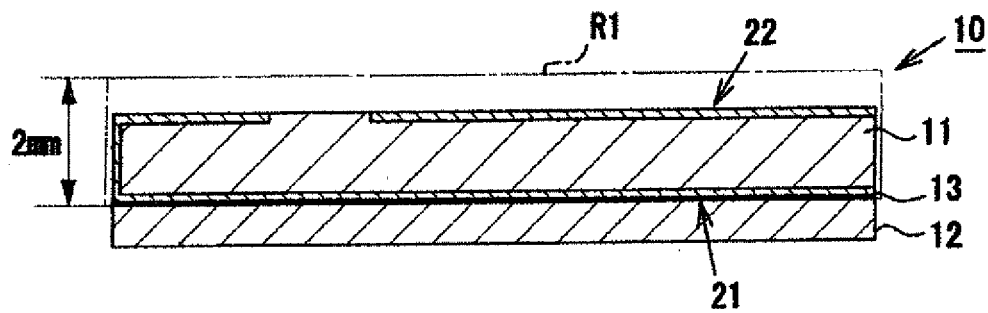
FIG. 4 illustrates the volume-ratio near the adhesion point of the piezoelectric-ceramic composition as an embodiment of this invention.

As shown in FIG. 3, the electromechanical-transformation device 10 of this invention is set within the chassis 18 of the ultrasonic flow meter 15. The acoustic-radiation surface 21 (see FIG. 4) (of which is the rigid body 12) is the acoustic-radiation surface and faces the U-shaped chemical-solution tube passage 16.

The piezoelectric-ceramic composition 11 comprises a crystal-phase perovskite structure that is formed according to Formula (2): $\{Li_x(K_{1-y}Na_y)_{1-x}\}_a(Nb_{1-z-w}Ta_zSb_w)O_3$.

This invention adopts the piezoelectric-ceramic composition 11 that is of the composition range of Formula (2): $0.90 \leq a \leq 1.2$, $0.02 \leq x \leq 0.2$, $0.2 \leq y \leq 0.08$, $0 \leq z \leq 0.5$, $0 \leq w \leq 0.2$. The electromechanical-transformation device 10 of this embodiment comprises the piezoelectric-ceramic composition 11, thus meeting the composition value of: a=0.98, x=0.04, y=0.54, z=0 and w=0.04.

The piezoelectric-ceramic composition 11, according to Formula (2), has a crystal structure, i.e. orthorhombic crystals, that is made at the side where the temperature is lower than the orthorhombic-to-tetragonal-phase transition temperature To-t, and has tetragonal crystals that are made at the side where the temperature is higher than the orthorhombic-to-tetragonal-phase transition temperature To-t and at the side where the temperature is lower than the tetragonal-to-cubic-phase transition temperature Tc, and of has cubic crystals that are made at the side where the temperature is higher than the tetragonal-to-cubic-phase transition temperature Tc. As an embodiment of this invention, the piezoelectric-ceramic composition 11 has an orthorhombic-to-tetragonal-phase transition temperature To-t of 30 degrees Celsius, a tetragonal-to-cubic-phase transition temperature (the Curie temperature) Tc of 345 degrees Celsius, and a piezoelectric-constant $d_{33}$ of 260 pC/N.

Hereinafter, the method for manufacturing the electromechanical-transformation device 10 is described.

First, prepare the base-powder (of 99% or more of purity of grade) of $K_2Co_3$, $Na_2CO_3$, $Li_2CO_3$, $Nb_2O_5$, $Ta_2O_5$ and $Sb_2O_3$. According to Formula (2), to achieve a=0.98, x=0.04, y=0.54, z=0 and w=0.04, weigh the base-powder containing each metallic element. Then, using a ball-mill, mix the base-power to get slurry. Next, soak the slurry in alcohol for 24 hours. The type of base-powder (compound) containing each metallic element is not limited. An oxidized material, a carbonate or the like of each metallic element can be used.

Dry the slurry, obtained in the above process, and calcinate it at 900 degrees Celsius for three hours. Using a ball-mill, crush the slurry for 24 hours. Add a polyvinyl alcohol-water solution to the slurry and pelletize it. Then, press the pelletized powder under 20 MPa of pressure into a disk 11.5 mm in diameter and 2.0 mm thick. Sinter the disk for 2.5 hours at 1,000 to 1,200 degrees Celsius, which is the appropriate temperature for obtaining a sintered body of maximum density.

Grind both surfaces of the sintered body simultaneously until it is a disk 10 mm in diameter and 1.4 mm thick. Apply the silver-paste (conductive-metal paste) onto both surfaces of the disk and heat the disk at 700 degrees Celsius to form the electrodes 23, 24. In silicone oil, apply a direct-current voltage of 3 kV/mm to the electrodes 23, 24 at 130 degrees Celsius for 20 minutes to achieve polarization in the direction of thickness, thereby making the piezoelectric-ceramic composition 11 (Polarization Process).

Using the thermosetting-adhesive of a curing-temperature range of 50 degrees Celsius higher than the orthorhombic-to-tetragonal-phase transition temperature To-t (equal to 30 degrees Celsius), and 50 degrees Celsius lower than the tetragonal-to-cubic transition temperature Tc (equal to 345 degrees Celsius), adhere the rigid body 12 to the acoustic-radiation surface 21 of the piezoelectric-ceramic composition 11. Of the embodiment of this invention, the epoxy-series adhesive of a curing temperature of 150 degrees Celsius is the thermosetting resin-series adhesive. The adhesion-process involves heating the epoxy-series adhesive to the curing temperature of 150 degrees Celsius to adhere the rigid body 12 to the piezoelectric-ceramic composition 11, thus manufacturing the electromechanical-transformation device 10.

The inventors repeatedly tested the electromechanical-transformation device 10 for the effect of cooling and heating upon it to confirm the deterioration of the piezoelectric property of said device 10 over time. The results of the test are shown in Chart 1.

Deterioration of the piezoelectric property over time was confirmed by the following method. First, connect the wires 26 and 27 to the electrodes 23, 24 of a pair of electromechanical-transformation devices 10 that were manufactured by the above method. Then, set the electromechanical-transformation devices 10 into the chassis 18 of the ultrasonic flow meter 15, as shown in FIG. 3. Then, pass ultrasonic waves between each device 10 and set the default transmission-reception sensitivity (the voltage-value of the received signals) of said ultrasonic waves. Then, remove the electromechanical-transformation devices 10 from the ultrasonic flow meter 15 and test the effect of cooling and heating upon them by repeatedly cooling them at 20 degrees Celsius below zero for one hour 100 times and heating them to 200 degrees Celsius for one hour 100 times. Then, again set the electromechanical-transformation devices 10 into the chassis 18 of the ultrasonic flow meter 15 and measure the transmission-reception sensitivity. Now compare the decreasing rate (dB) of the transmission-reception sensitivity of the ultrasonic waves after the cooling-heating-effect test with the default transmission-reception sensitivity setting of the ultrasonic waves before the cooling-heating-effect test. The results are shown in Chart 1. Working Example 1, as shown in Chart 1, means that the electromechanical-transformation device 10 was manufactured by the above method.

The inventors manufactured the electromechanical-transformation device 10 of Working Examples 2 to 6 and of Comparative Examples 1 to T by changing the curing temperature of the adhesive to have it effectively adhere to the rigid body 12, changing the materials used in forming the rigid body 12, changing the adhering position of the rigid body 12, and changing the thickness of the piezoelectric-ceramic composition 10. The cooling-heating-effect test was done on the electromechanical-transformation device 10 to calculate the decreasing rate (dB) of the transmission-reception sensitivity of the ultrasonic waves over time. The results are shown in Chart 1. Of the test, besides a silica-based ceramics being used as the material for making the rigid body 12, aluminum or polyether ether-ketone resin (PEEK) was used. The Young's modulus of aluminum is 70 GPa, and of the polyether ether-ketone resin the Young's modulus is 4 GPa. Although not shown in Chart 1, the linear-expansion coefficient of the aluminum and the polyether ether-ketone resin is 24 ppm/° C. and 45 ppm/° C. respectively.

CHART 1

| | Thickness (mm) | Adhesion | Adhering position | Volume ratio near adhesion (%) | Adhesion substances Material | Young's modulus (GPa) | Adhesive curing temperature (° C.) | Decreasing sensitivity Rate (dB) |
|---|---|---|---|---|---|---|---|---|
| Working Example 1 | 1.4 | Yes | Acoustic Radiation surface | 100 | Silica-based ceramics | 60 | 150 | −0.2 |
| Comparative Example 1 | 1.4 | Yes | Acoustic Radiation surface | 100 | Silica-based ceramics | 60 | 60 | −2.3 |
| Working Example 2 | 1.4 | Yes | Back surface | 100 | Silica-based ceramics | 60 | 150 | −0.1 |
| Comparative Example 2 | 1.4 | Yes | Back surface | 100 | Silica-based ceramics | 60 | 60 | −2.4 |
| Working Example 3 | 1.4 | Yes | Back surface | 100 | Aluminum | 70 | 150 | −0.1 |
| Comparative Example 3 | 1.4 | Yes | Back surface | 100 | Aluminum | 70 | 60 | −2.3 |
| Comparative Example 4 | 1.4 | Yes | Back surface | 100 | PEEK | 4 | 150 | −0.9 |
| Comparative Example 5 | 1.4 | Yes | Back surface | 100 | PEEK | 4 | 60 | −3.6 |
| Comparative Example 6 | 1.4 | No | — | 0 | — | — | — | −4.2 |
| Working Example 4 | 2 | Yes | Acoustic-Radiation surface | 100 | Silica-based ceramics | 60 | 150 | −0.2 |

CHART 1-continued

| | Thickness (mm) | Adhesion | Adhering position | Volume ratio near adhesion (%) | Adhesion substances Material | Young's modulus (GPa) | Adhesive curing temperature (° C.) | Decreasing sensitivity Rate (dB) |
|---|---|---|---|---|---|---|---|---|
| Working Example 5 | 3 | Yes | Acoustic Radiation surface | 67 | Silica-based ceramics | 60 | 150 | −0.3 |
| Working Example 6 | 5 | Yes | Acoustic Radiation surface | 40 | Silica-based ceramics | 60 | 150 | −0.4 |
| Comparative Example 7 | 7 | Yes | Acoustic Radiation surface | 29 | Silica-based ceramics | 60 | 150 | −0.6 |

The electromechanical-transformation device 10 of Working Example 2 is different from that of Working Example 1, since the rigid body 12 is adhered to the back surface 22 of the piezoelectric-ceramic composition 11. However, the other structures of said device 10 of Working Example 2 are the same as those of Working Example 1. Also, the electromechanical-transformation device 10 of Working Example 3 is different from that of Working Example 1, since the rigid body 12 that is adhered to the back surface 22 of the piezoelectric-ceramic composition 11 is made of aluminum. However, the other structures of said device 10 of Working Example 3 are the same as those of Working Example 1. The electromechanical-transformation device 10 of Working Examples 4 to 6 is different from that of Working Example 1, since the thickness of the piezoelectric-ceramic composition 11 of said device 10 of Working Examples 4 to 6 varies ranging from 2 to 5 mm. However, the other structures of said device 10 of Working Examples 4 to 6 are the same as those of Working Example 1.

The electromechanical-transformation device 10 of Comparative Example 1 is different from that of Working Example 1, since the curing temperature of the adhesive used to adhere the rigid body 12 (the acoustic-matching layer) is changed to 60 degrees Celsius. However, the other structures of said device 10 are the same as those of Working Example 1. The electromechanical-transformation device 10 of Comparative Example 2 is different from that of Working Example 2, since the curing temperature of the adhesive is changed to 60 degrees Celsius. However, the other structures of said device 10 are the same as those of Working Example 2. The electromechanical-transformation device 10 of Comparative Example 3 is different from that of Working Example 3, since the curing temperature of the adhesive is changed to 60 degrees Celsius. However, the other structures of said device 10 are the same as those of Working Example 3.

The electromechanical-transformation device 10 of Comparative Example 4 is different from that of Working Example 1, since the polyether ether-ketone resin (PEEK) is adhered to the back surface 22 of the piezoelectric-ceramic composition 11. However, the other structures of said device 10 are the same as those of Working Example 1. The electromechanical-transformation device 10 of Comparative Example 5 is different from that of Comparative Example 4, since the curing temperature of the adhesive is changed to 60 degrees Celsius. However, the other structures of said device 10 are the same as those of Comparative Example 4.

The electromechanical-transformation device 10 of Working Example 6 is different from that of Working Example 1, since the rigid body 12 is not adhered. However, the other structures of said device 10 are the same as those of Working Example 1. Regarding Comparative Example 6, grease must be applied between the acoustic-radiation surface 21 and the rigid body 12 (acoustic-matching layer) of the piezoelectric-ceramic composition 11, because the rigid body 12 is to be tightly set into the ultrasonic flow meter 15. Then, measure the transmission-reception sensitivity of the ultrasonic waves within the flow meter 15. The electromechanical-transformation device 10 of Comparative Example 7 is different from that of Working Example 1, since the thickness of the piezoelectric-ceramic composition 11 is changed to 7 mm. However, the other structures of said device 10 are the same as those of Working Example 1.

Figure 5:
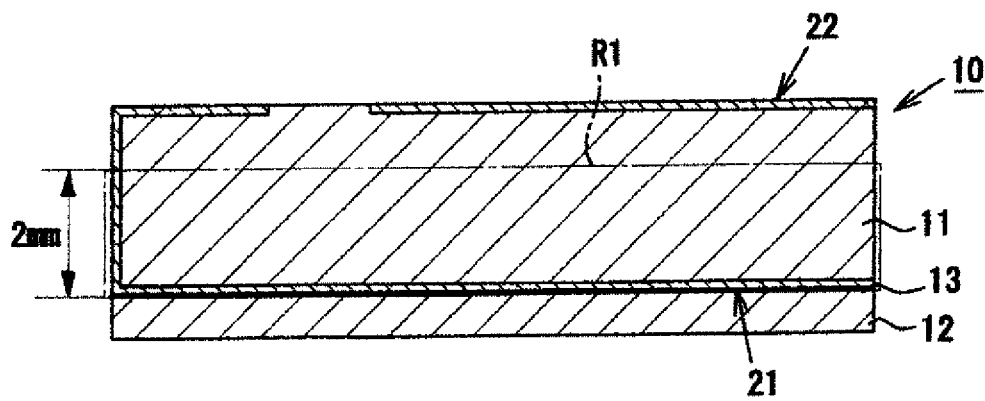
FIG. 5 further illustrates the volume-ratio near the adhesion point of the piezoelectric-ceramic composition as an embodiment of this invention.

The volume-ratio near the adhesive, as shown in Chart 1, means the percentage of volume of the piezoelectric-ceramic composition 11 within the range R1 (as described by the long-short dash-lines in FIGS. 4 and 5) wherein the distance from the place (on the surface of the adhesive layer 13) whereon the rigid body 12 is adhered to the piezoelectric-ceramic composition 11 is 2 mm or less against the entire volume of the piezoelectric-ceramic composition 11. Therefore, in adhering the rigid body 12 to the piezoelectric-ceramic composition 11 of 2 mm thick or less (according to Working Examples 1 to 4 and of Comparative Examples 1 to 5), the entire volume of said composition 11 is included within the range R1. Thus, the volume-ratio near the adhesive is 100%. (See FIG. 4)

If the piezoelectric-ceramic composition 11 is 2 mm thick or more, it partially exceeds the range R1. Thus, the volume-ratio near the adhesion is smaller (see FIG. 5). Of the case of Working Example 5 of which the rigid body 12 is adhered to the piezoelectric-ceramic composition 11 that is 3 mm thick, the volume-ratio near the adhesion is 67%. In the case of Working Example 5 of which the rigid body 12 is adhered to the piezoelectric-ceramic composition 11 that is 5 mm thick, the volume-ration near the adhesion is 40%. In the case of the Comparative Example 7 of which the rigid body 12 is adhered to the piezoelectric-ceramic composition 11 that is 7 mm thick, the volume-ration near the adhesion is 29%. In case of Comparative Example 6 of which the rigid body 12 is not adhered to the piezoelectric-ceramic composition 11, the volume-ration near the adhesion is 0%.

In the case of Working Examples 2 and 3 and of Comparative Examples 2 to 5, of which the rigid body is adhered to the back surface 22, of the acoustic-radiation surface 21, of the piezoelectric-ceramic composition 11, make the acoustic-matching layer out of the same material and of the same shape as the rigid body 12 of Working Example 1 and adhering the acoustic-matching layer against the acoustic-radiation surface 21, of the piezoelectric-ceramic composition 11, using grease, to measure the transmission-reception sensitivity of the ultrasonic waves. As such, the acoustic-matching layer gives the same measuring-condition as that of the Working Example 1, thus making it possible to correctly identify the adhesion effect of the rigid body 12.

As shown in Chart 1, regarding Working Examples 1 to 6, the rigid body 12, (made of silica-based ceramics or of aluminum) and having a Young's modulus of 60 GPa or more, is adhered to the surface of the piezoelectric-ceramic composition 11 by heating said surface at 150 degrees Celsius. Of Working Examples 1 to 6, the volume-ratio near the adhesion place of the piezoelectric-ceramic composition 11 is within the range R1 of which the distance from the place on the rigid body 12, being adhered to the piezoelectric-ceramic composition 11, is 2 mm or less thick, the volume-ratio is 40% or more. Thus, of Working Examples 1 to 6, the decreasing-rate of the transmission-reception sensitivity of the ultrasonic waves, as shown by the cooling-heating-effect test, is 0.4 dB to −0.1 dB (less than 5%), thus confirming that the piezoelectric-ceramic composition 11 is less likely to deteriorate over time. In the case of Working Examples 1 to 4 of which the volume-ratio near the adhesion place, of the piezoelectric-ceramic composition 11 is 100%, the decreasing-rate of the transmission-reception sensitivity of the ultrasonic waves is low, i.e., 0.2 dB to −0.1 dB, which makes it possible to obtain a piezoelectric-ceramic composition 11 of which the piezoelectric-property is less likely to deteriorate over time. In other words, regarding Working Examples 1 to 6, adhering the rigid body 12 causes an external force in the direction where the lattice-distortion that is induced by phase-transition is controlled. Thus, such a phase-transition is unlikely to occur. Thus, the progression of depolarization by repetition of the lattice-distortion is controlled, thus decreasing the piezoelectric-property degradation over time. Also, the adhesion place of the rigid body 12 is not only the acoustic-radiation surface 21 of the piezoelectric-ceramic composition 11, but in the case of Working Examples 2 and 3 of which the rigid body 12 is adhered to the back surface 22 of said composition 11, the decreasing-rate of the transmission-reception sensitivity of the ultrasonic waves is low, with the value being −0.1 dB, thus confirming that the piezoelectric-property of said composition 11 is unlikely to deteriorate over time.

In the case of Comparative Example 6 of which the rigid body 12 is not adhered to the piezoelectric-ceramic composition 11, repeating the phase-transition with changes in the temperature involving the orthorhombic-to-tetragonal-phase-transition temperature To-t, progresses the depolarization of the piezoelectric-ceramic composition 11. Therefore, in the case of Comparative Example 6, the decreasing-rate of the transmission-reception sensitivity of the ultrasonic waves was shown to be −4.2 dB after the cooling-heating-effect test, meaning that the transmission-reception sensitivity had decreased by about 40%. Also, it was verified that as one of the properties of the electromechanical-transformation device 10, the piezoelectric-constant $d_{33}$ that had been initially 260 pC/N, decreased to 160 pC/N, as shown by the cooling-heating-effect test.

Regarding Comparative Examples 1 to 3 of which the curing temperature of the rigid body 12 is low (60 degrees Celsius), the adhesion of the rigid body 12 to the piezoelectric ceramic composition 11 is of little effectiveness, and the decreasing-rate of the transmission-reception sensitivity of the ultrasonic waves, as shown by the cooling-heating-effect test, is −2.3 dB (over 20%). Regarding Comparative Examples 4 and 5 of which the polyether ether-ketone resin having a lower Young's modulus is adhered, the effectiveness of the adhesion is slight, and then the decreasing-rate of the transmission-reception sensitivity of the ultrasonic waves is −0.9 dB or less (over 10%), thus showing time-degradation of the piezoelectric property. Regarding Comparative Example 7 of which the piezoelectric-ceramic composition 11 is 7 mm thick, the volume-ratio near the adhesion place is 29%. In other words, the volume-percentage of the piezoelectric-ceramic composition 11, which exceeds the range R1 wherein the distance from the adhesion place of the rigid body 12, is 2 mm or less, the volume-percentage increases to about 70%. Thus, regarding Comparative Example 7, the adhesion effect of the rigid body 12 on the piezoelectric ceramic composition 11 cannot sufficiently be obtained as is shown by the decreasing-rate of the transmission-reception sensitivity of the ultrasonic waves is being −0.6 dB, thus confirming the degradation of the piezoelectric property.

Therefore, according to the embodiment of this invention, the following effect can be obtained.

(1) Of each piezoelectric-ceramic composition 11 of Working Examples 1 to 6, the comparatively hard rigid body 12, having a Young's modulus of 60 GPa or more is adhered to the acoustic-radiation surface 21 by the intermediary of the electrode 23, and that the adhesion of the rigid body 12 is sufficiently secured such that the volume-ratio (near the adhesion) of the piezoelectric-ceramic composition 11 within the range of which the distance from the adhesion of the rigid body 12 is 2 mm or less, said volume-ratio should be 40% or more. As such, even if there is a change in temperature involving the orthorhombic-to-tetragonal-phase transition temperature to-t, the rigid body 12 that is adhered to the piezoelectric-ceramic composition 11 makes it unlikely that the crystal-structural-phase transition (the tetragonal crystal changing to the orthorhombic crystal) of the piezoelectric-ceramic composition 11 will occur. Especially, if the thickness of the piezoelectric-ceramic composition 11, as the basis of the adhesion place with the said composition 11 and the rigid body 12 is 2 mm or less (in case of Working Examples 1 to 4), the volume-ratio near the adhesion becomes 100%. Thus, such a rigid body 12 makes it possible to surely prevent the phase-transition of the piezoelectric-ceramic composition 11, thus preventing time-degradation of the piezoelectric-property of the piezoelectric-ceramic composition 11, which increases product-reliability of the ultrasonic flow meter 15.

(2) The ultrasonic flow meter 15 that is used in the embodiment of this invention is provided on the chemical-solution circulating-line to measure the flow-volume of the chemical solution W1 being supplied to the semiconductor-manufacturing equipment. Said flow meter 15 is used in a harsh environment in which the operating-temperature ranges from 0 to 200 degrees Celsius. In other words, the orthorhombic-to-tetragonal-phase-transition temperature To-t (=30 degrees Celsius) is within this operating-temperature range. Thus, whilst the ultrasonic flow meter 15 is being used, the temperature of the electromechanical-transformation device 10 exceeds or falls below the orthorhombic-to-tetragonal-phase-transition temperature To-t. Even if there are is such a change in temperature, the rigid body 12 adhered to the piezoelectric-ceramic composition 11 makes it unlikely for the crystal-structural-phase transition to occur, thus preventing degradation of the piezoelectric-property of said composition 11 over time. The tetragonal-to-cubic-phase transition temperature Tc (=345 degrees Celsius) of the piezoelectric-ceramic composition 11 is within a higher temperature-range than the operating-temperature limit of the ultrasonic flow meter 15. In this case, the temperature of the electromechanical-transformation device 10, whilst using the ultrasonic flow meter 15, will not rise to a higher temperature side than the tetragonal-to-cubic-phase transition temperature Tc, thus avoiding the progression of depolarization of the piezoelectric-ceramic composition 11, and thus maintaining a favorable piezoelectric-property. Therefore, the ultrasonic flow meter 15 of the embodiment of this invention makes it possible to correctly measure the flow-volume of the chemical solution W1.

(3) Regarding the electromechanical-transformation device 10 as the embodiment of this invention, the rigid body 12 is adhered to the piezoelectric-ceramic composition 11 by an epoxy-series adhesive to achieve sufficient adhesiveness. The epoxy-series adhesive is of appropriate stiffness for transmitting ultrasonic vibrations, thus making it possible for the electromechanical-transformation device 10 to emit ultrasonic vibrations efficiently.

(4) The embodiment of this invention has a high Curie temperature of 340 degrees Celsius or more, thus imbuing the alkaline-niobate-series piezoelectric-ceramic composition 11 with a piezoelectric property that is of a piezoelectric-constant 260 pC/N or more. Therefore, the electromechanical-transformation device 10 using such a piezoelectric-ceramic composition 11 allows for efficient transmission and reception of ultrasonic sound waves, thus ensuring product-reliability of the ultrasonic flow meter 15. Also, the piezoelectric-ceramic composition 11 is manufactured free of lead, thus avoiding harm to the environment in disposing of the electromechanical-transformation device 10.

(5) Regarding Working Examples 1, 2 and 4 to 6, in using the silica-based ceramic adhesive of silica (SiO2) as the main ingredient, it is possible to get a rigid body 12 having a Young's modulus of 60 GPa or more. Regarding Working Examples 1, 4 to 6, the rigid body 12 that is adhered to the acoustic-radiation surface 21 of the piezoelectric-ceramic composition 11, is of thickness t corresponding to one fourth (¼) of the ultrasonic wavelength A (=v/f) being emitted from the acoustic-radiation surface 21, thus letting the rigid body 12 act as an acoustic-matching layer, thus allowing for the ultrasonic waves to be emitted efficiently from the electromechanical-transformation device 10. It is thus unnecessary to prepare separately the rigid body 12 and acoustic-matching layer, thereby reducing the cost of components in making the electromechanical-transformation device 10.

(6) Regarding Working Example 3, in using aluminum adhesive, it is possible to get a rigid body 12 having a Young's modulus of 70 GPa. Also, since aluminum is a comparatively light metal, the weight of the electromechanical-transformation device 10 and rigid body 12 is reduced.

(7) The epoxy-series adhesive that is used as an embodiment of this invention has a curing temperature (of 150 degrees Celsius), which is higher than the orthorhombic-to-tetragonal-phase transition temperature To-t by 50 degrees Celsius or more, and lower than the tetragonal-to-cubic phase transition temperature Tc by 50 degrees Celsius. The rigid body 12 is adhered to the piezoelectric-ceramic composition 11 within the temperature range—specifically at 150 degrees Celsius at which temperature the crystal structure of said composition 11 is a tetragonal crystal—that is higher than the orthorhombic-to-tetragonal-phase transition temperature To-t by 50 degrees Celsius or more, and lower than the tetragonal-to-cubic phase transition temperature Tc by 50 degrees Celsius. As such, the adhesion of the rigid body 12 to said composition 11 does not bring the tetragonal-crystal-phase transition to the crystal structures, thus preventing the progression of depolarization of said composition 11. Even if the temperature becomes lower than the orthorhombic-to-tetragonal-phase transition temperature To-t, the rigid body 12 works an external force to maintain the lattice-distortion of the tetragonal crystal, thus making it unlikely that the tetragonal crystal will change into a orthorhombic crystal, and thus preventing time-degradation of the piezoelectric property of the piezoelectric-ceramic composition 11.

(8) Of the embodiment of this invention, the rigid body 12 comprising the electromechanical-transformation device 10 is thinner than the piezoelectric-ceramic composition 11, and the adhesive 13 that adheres said rigid body 12 to said composition 11 is thinner than the rigid body 12, which makes it possible to make said device 10 more compactly and thinner, thereby letting it easily to be set into the chassis 18 of the ultrasonic flow meter 15 of the electromechanical-transformation device 10. If the layer of the adhesive 13 is too thick, it works as a damping material (buffer), lowering the sensitivity of the electromechanical-transformation device 10. Since the stiffness of the adhesive 13 is lower than that of the rigid body 12, the layer of adhesive 13 that is too thick decreases the effect in controlling the lattice-distortion caused by the phase-transition, thus resulting in degradation of the piezoelectric-property of the piezoelectric-ceramic composition 11 over time. Contrarily, the embodiment of this invention adopts an adhesive layer 13 of tens of μm thick, which does not adversely affect the propagation of the ultrasonic waves, thus surely avoiding the sensitivity-degradation of the electromechanical-transformation device 10.

The embodiment of this invention can be modified, as follows.

Of the embodiment of this invention, as described above, the rigid body 12 is formed such that the following formula is established: $t=\{v/(4\,f)\}\pm 10\%$ (t=thickness of the rigid body 12, f=resonance frequency of the piezoelectric-ceramic composition 11, v=acoustic velocity within the rigid body 12). However, it is possible to form the rigid body 12 to meet the condition of formula $t=\{v/(2\,f)\}\pm 10\%$. In other words, it is possible to form the rigid body 12 of a thickness that is ½ times that of the ultrasonic wavelength A. This enables the rigid body 12 to act as an acoustic-matching layer, thus efficiently emitting ultrasonic waves from the piezoelectric-ceramic composition 11 by the intermediary of the rigid body 12, in which case the thickness t of the rigid body 12 is twice that of the aforementioned embodiment. The electromechanical-transformation device 10 of the embodiment, as described above, adopts the rigid body 12 of a smaller thickness than that of the piezoelectric-ceramic composition 11. However, it is possible to adhere the rigid body 12 of a larger thickness than that of the piezoelectric-ceramic composition 11 in making the electromechanical-transformation device 10. However, if the thickness of the rigid body 12 is too large, the oscillatory-load will become too heavy. Contrarily, if the thickness of the rigid body 12 is too small, its strength will be insufficient, thus losing its effect, which would make it difficult for the phase-transition to occur. Thus, it is better to form the rigid body 12 according to the appropriate thickness t and in consideration of the strength or the oscillatory of the formation-materials of the rigid body 12, as well as the resonance-frequency of the piezoelectric-ceramic composition 11 and of the acoustic-velocity v within the rigid body 12.

Of the electromechanical-transformation device 10 of the embodiment, as described above, the rigid body 12 adhered to the piezoelectric-ceramic composition 11 is disk-shaped, but it is not limited to being disk-shaped. The rigid body 12, for example, can be a frame-shaped (ring-shaped) body having a hole in the center, or it is as a lattice-shaped body having multiple holes. Also, besides a circular-rigid body, it is possible to adopt other shapes such as a triangle, a square or a polygonal, in which case there are some areas on the adhesion surface (the first-major surface 21 (acoustic-radiation surface 21) or on the second-major surface 22) (the back surface 22) of the piezoelectric-ceramic composition 11 to be formed, on which the rigid body 12 is not adhered. Even in this case, the rigid body 12 should be adhered such that the volume-ratio near the adhesion place of the piezoelectric-ceramic composition 11 is 40% or more.

Figure 6:
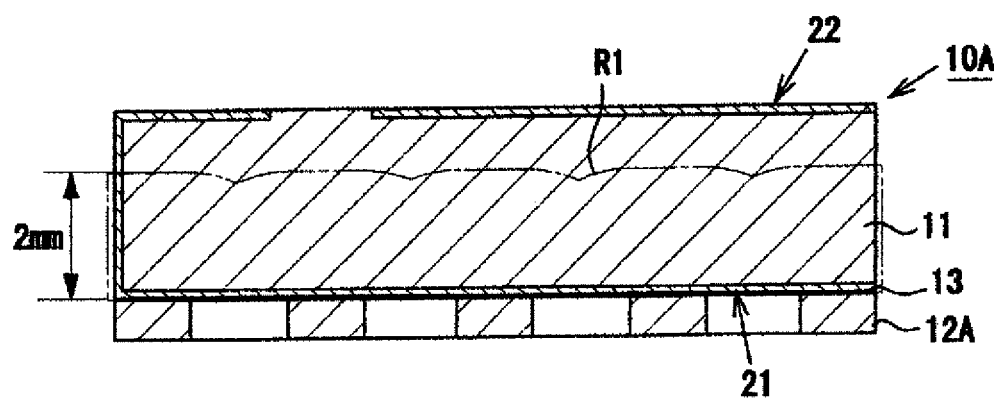
FIG. 6 further illustrates the volume-ratio near the adhesion point of the piezoelectric-ceramic composition as an embodiment of this invention.

FIG. 6 shows the embodiment of the electromechanical-transformation device 10A on which the lattice-shaped rigid body 12A is adhered to the first-major surface 21 (acoustic-radiation surface 21) of the piezoelectric-ceramic composition 11. Also shown in FIG. 6 is the rigid body 12A being of a specific size and of the lattice intervals adhered (to said composition 11) such that the volume-percentage (volume-ratio near the adhesion place) of the piezoelectric-ceramic composition 11, being within the range R1 (shown by the long-and-short dash-lines) where the distance from the adhesion point place of the piezoelectric-ceramic composition 11 and of the rigid body 12A is 2 mm or less, is 40% or more. In this case where the lattice-shaped rigid body 12A is being used, it is better to set the width of the gap of the lattice of the rigid body 12A at 2 mm or less, thus making it possible to secure the proper volume-ratio near the adhesion place of the piezoelectric-ceramic composition 11. Such an adhesion-effect of the rigid body 12A prevents the piezoelectric property of the piezoelectric-ceramic composition 11 from degrading over time.

Figure 7:
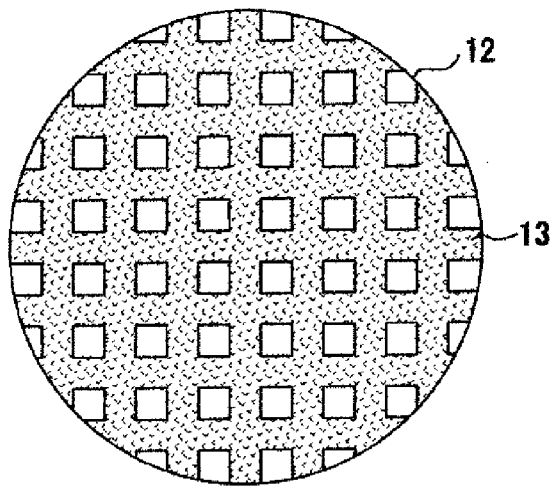
FIG. 7 illustrates the adhesion-pattern of the rigid body as an embodiment of this invention.
Figure 8:
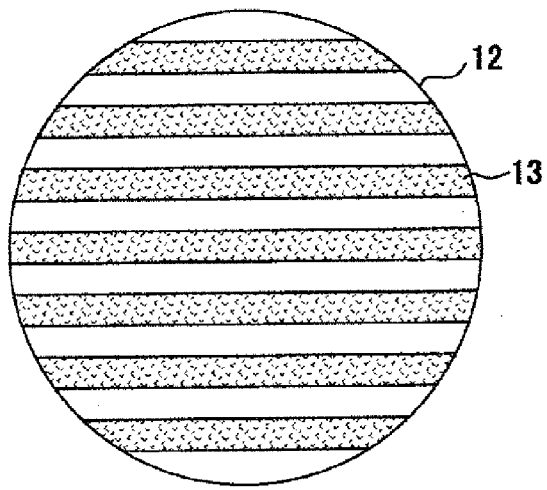
FIG. 8 further illustrates the adhesion-pattern of the rigid body as an embodiment of this invention.
Figure 9:
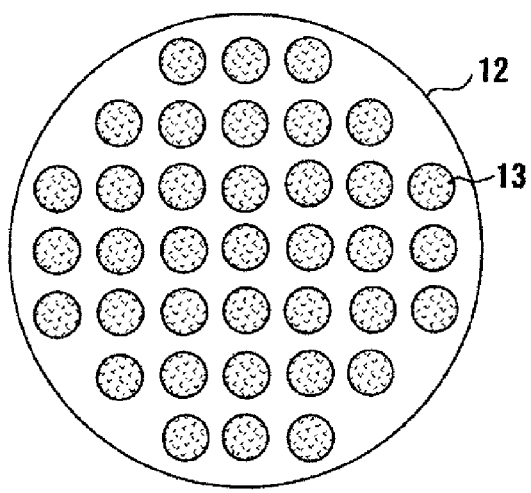
FIG. 9 further illustrates the adhesion-pattern of the rigid body as an embodiment of this invention.

Of the electromechanical-transformation device 10 of the embodiment as described above, the adhesive 13 is provided on the entire interface of the piezoelectric-ceramic composition 11 and the rigid body 12, to adhere the rigid body 12 to said composition 11, but a different formation-pattern can be used. The formation-pattern of the adhesive 13 formed on the interface of the piezoelectric-ceramic composition 11 and the rigid body 12 can also be a lattice as shown in FIG. 7 or lines as shown in FIG. 8 or dots as shown in FIG. 9. When adopting one of the adhesion-patterns as shown in FIGS. 7 to 9, the rigid body 12 is adhered according to the interval and width of the pattern such that the volume-ratio near the adhesion place is 40% or more. In the adhesion process, the rigid body 12 can also be adhered to the piezoelectric-ceramic composition 11 after applying the adhesive 13 to the surface of the rigid body 12 or after applying it to the surface of the piezoelectric-ceramic composition 11.

Of the electromechanical-transformation device 10 of the embodiment as described above, the rigid body 12 is formed of the silica-based ceramics whilst being adhered to the first-major surface 21 (acoustic-radiation 21) (in the case of Working Examples 1 and 4 to 6), or it is formed of the silica-based ceramics or of aluminum whilst the rigid body 12 is being adhered onto the second-major surface 22 (back surface 22), in the case of Working Examples 2 and 3. The rigid body 12 is not limited to being made of a silica-based ceramics or of aluminum but of other materials having a Young's modulus of 60 GPa or more. Specifically, the rigid body 12 to be adhered to the first-major surface 21 and to the second-major surface 22 includes a rigid body 12 containing not only silica but aluminum or silica-alumina as the major ingredient. The rigid body 12 to be adhered to the second-major surface 22 includes not only aluminum but also copper or stainless steel or the like.

Figure 10:
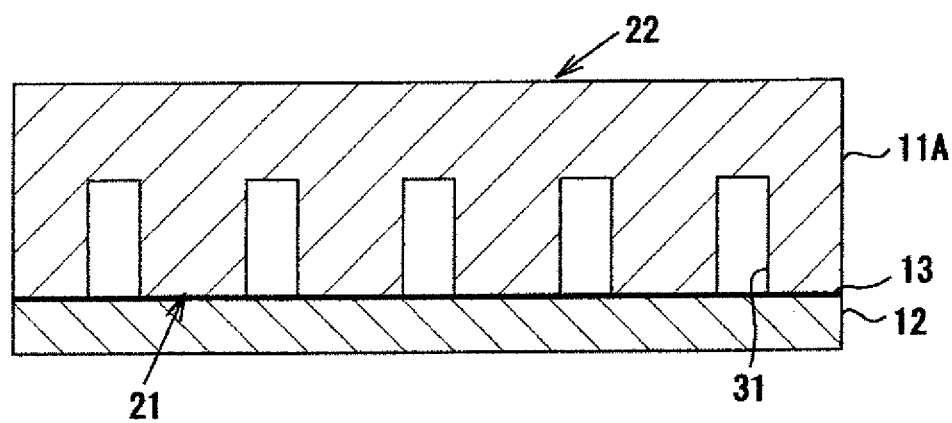
FIG. 10 is another cross-sectional view of the electromechanical-transformation device as the embodiment of this invention.
Figure 11:
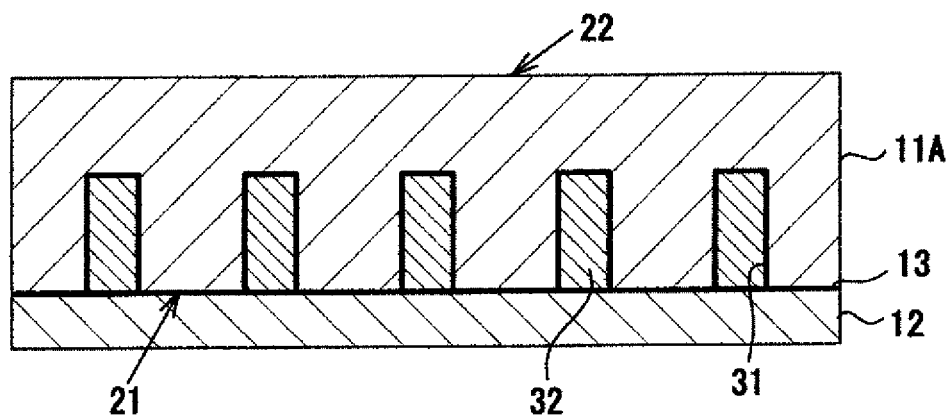
FIG. 11 is still another cross-sectional view of the electromechanical-transformation device as the embodiment of this invention.

Of the electromechanical-transformation device 10 of the embodiment as described above, the piezoelectric-ceramic composition 11 is disk-shaped. The first-major surface 21 or the second-major surface 22 to be adhered to the rigid body 12 is flat but is not necessarily so, for it is possible to provide a mesh-like slit (groove portion) on either the first-major surface 21 or the second-major surface 22 of the piezoelectric-ceramic composition 11. The slit formed on the surface of said composition 11 allows for greater flexibility transversely, thus improving the piezoelectric property of said composition 11. As such, the electromechanical-transformation device 10 is made by adhering the rigid body 12 to the piezoelectric-ceramic composition 11 having a surface whereof the slit 31 is formed or is not formed. Regarding the piezoelectric ceramic-composition 11A as shown in FIG. 10, whilst adhering the rigid body 12 to the surface 21 whereon the slit 31 is formed, an air-gap is formed on the concave portion of the slit 31, in which case it is possible to insert an elastic material such as rubber or the like into the concave portion. As shown in FIG. 11, it is also possible to insert a hard material 32 such as an epoxy-resin into the concave portion of the slit 31, thus preventing the air-gap from forming between the rigid body 12 and the piezoelectric-ceramic composition 11A. As such, an acoustic-impedance of the electromechanical-transformation device 10 (an ultrasonic-transducer) changes to allow for a more efficient acoustic-coupling, thus allowing a reinforcing-effect of the piezoelectric-ceramic composition 11A, thus maintaining the adhesiveness of the piezoelectric-ceramic composition 11A and of the hard material 32 as a filler. Using the hard material 32 having a Young's modulus of 60 GPa or more makes it possible to control the lattice-distortion occurring during the phase-transition of the piezoelectric-ceramic composition 11A.

Of the embodiment as described above, it is possible to set the piezoelectric-ceramic composition 11 into the chassis 18 or into a sensor-mounting holder or the like that comprises the ultrasonic flow meter 15, so that such the chassis 18 or holder or the like can act as a the rigid body. In this case, it is necessary to use a material having a Young's modulus of 60 GPa or more.

Of the electromechanical-transformation device 10 as the embodiment as described above, the rigid body 12 is adhered to the piezoelectric-ceramic composition 11 by a thermosetting resin-series adhesive such as an epoxy-series adhesive. However, the type of adhesive can be changed. Beside an epoxy-resin type, a polyimide-resin adhesive can be used or a thermoplastic adhesive or light-curing adhesive can be used. Moreover, when the rigid body 12 is formed in using a material of high soderability, solder can be used as the adhesive. It is also possible to form the rigid body 12 by incorporating the adhesive ingredient and by heating it until the adherence-property expresses on the surface of the rigid body 12, thus making it possible to adhere the rigid body 12 to the piezoelectric-ceramic composition 11.

Of the electromechanical-transformation device 10 as the embodiment as described above, the rigid body 12 is adhered to the piezoelectric-ceramic composition 11 by attaching the electrodes 23, 24 to the major surfaces 21 and 22 of the piezoelectric-ceramic composition 11, yet those surfaces are not the only ones available. For example, when forming the rigid body 12 using an electrical-conducting material such as metal or the like, it is possible to directly adhere the rigid body 12 (now acting as an electrode) to the major surfaces 21 and 22 of the piezoelectric-ceramic composition 11, thus forming the electromechanical-transformation device 10. Whilst forming the thick-type of the piezoelectric-ceramic composition 11, the rigid body 12 can be adhered directly to a side-surface of said device 10 on which the electrodes 23, 24 have not been formed.

Of the embodiment as described above, it is possible to add the metallic elements Bi, Fe or the like to the piezoelectric-ceramic composition 11, thus making said composition 11 having a favorable piezoelectric property.

Of the embodiment as described above, the electromechanical-transformation device 10 is used as an ultrasonic-sensor of the ultrasonic flow meter 15, but the said device 10 is not limited to that use. For example, it can be used as an air-bubble detection-sensor to measure the decreasing rate of the ultrasonic waves propagating against the circulating chemical solution and to detect the existence or non-existence of the bubbles based on the a decreasing rate of the ultrasonic waves. Also, the said device 10 can be used as an ultrasonic-concentration meter to detect the concentration of the circulating chemical solution based on the decreasing rate of the ultrasonic waves. Also, the said device 10 can be used as a knocking-sensor or actuator in an engine, in an ultrasonic-transducer or in an ultrasonic washing machine or the like. Finally, the electromechanical-transformation device 10 is disk-shaped. However, the shape or size of said device 10 can be changed according to the intended use.

Besides the technical ideas of this invention as described above, the technical ideas as described hereinafter are to be understood.

(1) An electromechanical-transformation device according to any one of the first to eighth aspects of this invention is characterized in that the volume-percentage of the piezoelectric-ceramic composition is within the range in which the distance from the adhesion place of said composition and the rigid body is 2 mm or less, and that the percentage of volume against the whole volume of the piezoelectric-ceramic composition is 45% or more.

(2) An electromechanical-transformation device according to any one of the first to eighth aspects of this invention is characterized in that the Young's modulus of the rigid body is 65 GPa or more.

(3) An electromechanical-transformation device according to any one of the first to eighth aspects of this invention is characterized by the Young's modulus of the rigid body being from 65 GPa to 80 GPa.

(4) An electromechanical-transformation device according to any one of the first to eighth aspects of this invention is characterized in that the linear-expansion coefficient of the rigid body is 24 ppm/° C. or less.

(5) An electromechanical-transformation device according to any one of the first to eighth aspects of this invention is characterized in that the linear-expansion coefficient of the rigid body is from 7 ppm/° C. to 24 ppm/° C.

(6) An electromechanical-transformation device according to any one of the first to eighth aspects of this invention is characterized in that the thickness of the rigid body is smaller than that of the piezoelectric-ceramic composition, and that the thickness of the adhesive that is used in adhering the rigid body to said composition is smaller than that of the rigid body.

(7) An electromechanical-transformation device according to any one of the first to eighth aspects of this invention is characterized in that the thickness of the rigid body is smaller than that of the piezoelectric-ceramic composition, and that the thickness of the adhesive that is used in adhering the electrode and rigid body to said composition is smaller than that of the rigid body.

(8) An electromechanical-transformation device according to any one of the first to eighth aspects of this invention is characterized in that the electrode is formed by heating the conductive metal-paste.

(9) An electromechanical-transformation device according to any one of the first to eighth aspects of this invention is characterized in that the piezoelectric-ceramic composition is lead-free.

(10) An electromechanical-transformation device according to any one of the first to eighth aspects of this invention is characterized in that the piezoelectric-ceramic composition is an alkaline-niobate series-ceramic composition having a crystal phase of a perovskite structure.

(11) An electromechanical-transformation device according to any one of the first to eighth aspects of this invention is characterized in that the thickness of the piezoelectric-ceramic composition—as the standard of the adhesion of the piezoelectric-ceramic composition 11 and the rigid body 12—is 2 mm or less.

(12) An electromechanical-transformation device according to any one of the first to eighth aspects of this invention is characterized in that the piezoelectric-ceramic composition is formed in the shape of a plate comprising the first-major surface and second-major surface, and that the rigid body is plate-like and of the same size or larger than that of the outer-diameter of the piezoelectric-ceramic composition to be adhered onto the entire first-major surface and second-major surface of said composition.

(13) An electromechanical-transformation device according to any one of the first to eighth aspects of this invention is characterized in that the piezoelectric-ceramic composition is formed into the shape of a plate comprising the first-major surface as an acoustic-radiation surface and the second-major surface as the back of the acoustic-radiation surface.

(14) An electromechanical-transformation device according to any one of the first to eighth aspects of this invention is characterized in that the orthorhombic-to-tetragonal-phase transition temperature is within 0 to 100 degrees Celsius, and that the curing temperature of the adhesive is 150 degrees Celsius.

(15) An electromechanical-transformation device, according to the third or fourth aspect of this invention, is characterized in that the adhesive comprises a thermosetting epoxy-resin that is cured at a temperature exceeding 100 degrees or more than the orthorhombic-to-tetragonal-phase transition temperature.

(16) An electromechanical-transformation device according to any one of the first to eighth aspects of this invention is characterized in that said device is set in a place that is heated to 100 degrees Celsius or more when in use.

(17) An electromechanical-transformation device, according to any one of the first to eighth aspects of this invention, is characterized in that said device is set into the ultrasonic flow meter to measure the volume of flow of the chemical solution being supplied to the semiconductor-manufacturing equipment.

(18) An electromechanical-transformation device, according to any one of the first to eighth aspects of this invention, is characterized in that said device is used as an ultrasonic sensor to transmit and receive ultrasonic waves, and that after 100 cycles of a thermal-effect test that was done within a temperature-range that is lower and higher than the orthorhombic-to-tetragonal-phase transition temperature, the decreasing-rate of the transmission-reception sensitivity was found to be 5% or less than the default value set before the thermal-effect test.

10, 10A: Electromechanical-transformation device
11, 11A: Piezoelectric-ceramic composition
12, 12A: Rigid body
21: First-major surface (Acoustic-radiation surface) as the main surface
22: Second-major surface (Back surface) as the main surface
23, 24: Electrode
R1: Range less than 2 mm
To-t: Orthorhombic-to-tetragonal-phase transition temperature
Tc: Tetragonal-to-cubic-phase transition temperature

The invention claimed is:

1. An ultrasonic flow-meter for measuring the flow-rate of a chemical-solution flowing within a chemical-solution circulation-line that is integrated in semiconductor manufacturing-equipment comprising:
a liquid-pressure tube on which a straight-running tube having an upper and a lower edge is formed, and
a pair of ultrasonic-sensors that are mounted on the upper and lower edges respectively for sending and receiving ultrasonic-waves through the chemical-solution flowing within the straight-running tube, wherein
an electro-mechanical transformation device is used as the pair of ultrasonic-sensors, and that the rigid side of the electro-mechanical transformation device is provided facing the straight-running tube,
the electro-mechanical transformation device further comprising:
a piezoelectric ceramic member having a piezoelectric ceramic composition, the piezoelectric ceramic composition having a crystal structure including an orthorhombic crystal at ambient temperature, the piezoelectric ceramic composition exhibiting a phase transition from the orthorhombic crystal to a tetragonal crystal at an orthorhombic to tetragonal phase transition temperature and a phase transition from the tetragonal crystal to a cubic crystal at a tetragonal to cubic phase transition temperature, and
wherein that the electromechanical-transformation device comprises a rigid body having a Young's modulus of 60 GPa or more and comprises the piezoelectric-ceramic member of which a volume-percentage, being within the range of which the distance from the point of attachment of the rigid body to the piezoelectric-ceramic member is two mm or less, is 40% or more as compared to the whole piezoelectric-ceramic member and the piezoelectric-ceramic member has a major surface acting as an acoustic radiation surface and is plate-shaped with a thickness of 5 mm or less, that the rigid body is directly adhered to the major surface of a piezoelectric-ceramic member or indirectly to the major surface by the intermediary electrodes and acts as an acoustic-matching layer to emit ultrasonic waves, and that the thickness of the rigid body is formulized as $t=\{v/(4f)\}\pm10\%$ or $t=\{v/(2f)\}\pm10\%$ of which f means the resonance-frequency of the piezoelectric-ceramic member and v means the acoustic-velocity of the rigid body and t means the thickness of the rigid body,
wherein the piezoelectric-ceramic composition is formulized as $\{Li_x(K_{1-y}Na_y)_{1-x}\}_a(Nb_{1-z-w}Ta_zSb_w)O_3$ within a composition-range of $0.90 \leq a \leq 1.2$, $0.02 \leq x \leq 0.2$, $0.2 \leq y \leq 0.8$, $0 \leq z \leq 0.5$, $0 \leq w \leq 0.2$ and the rigid body is made of a ceramic composition containing silica, alumina, or silica-alumina as a major ingredient.

2. The ultrasonic flow meter of claim 1, wherein the rigid body is adhered to the piezoelectric-ceramic member by a thermosetting resin-adhesive.

3. The ultrasonic flow meter of claim 1, whereof the rigid body is adhered to the piezoelectric-ceramic member by an epoxide-based adhesive.

4. The ultrasonic flow meter of claim 2, whereof the adhesive that adheres the rigid body to the piezoelectric-ceramic composition has a curing temperature within the range exceeding the orthorhombic-to-tetragonal-phase transition temperature by 50 degrees Celsius or more and that is falls below the tetragonal-to-cubic-phase transition temperature by 50 degrees Celsius or more.

5. The ultrasonic flow meter of claim 3, whereof the adhesive that adheres the rigid body to the piezoelectric-ceramic composition has a curing temperature within the range exceeding the orthorhombic-to-tetragonal-phase transition temperature by 50 degrees Celsius or more and that is falls below the tetragonal-to-cubic-phase transition temperature by 50 degrees Celsius or more.

* * * * *

UNITED STATES PATENT AND TRADEMARK OFFICE
CERTIFICATE OF CORRECTION

PATENT NO. : 10,401,204 B2
APPLICATION NO. : 15/338604
DATED : September 3, 2019
INVENTOR(S) : Nagareda et al.

It is certified that error appears in the above-identified patent and that said Letters Patent is hereby corrected as shown below:

On the Title Page

Item (57), in the Abstract:

Line 8:
"temperature, tetragonal crystals formed at the side where"
Should read:
"temperature, tetragonal crystals formed at the side where the"

Line 9:
"temperature is higher that the orthorhombic-to-tetragonal"
Should read:
"temperature is higher than the orthorhombic-to-tetragonal"

Line 14:
"cubic phase temperature. Young's modulus of the rigid is 60"
Should read:
"cubic phase transition temperature. Young's modulus of the rigid body is 60"

Signed and Sealed this
Seventh Day of April, 2020

Andrei Iancu
*Director of the United States Patent and Trademark Office*